United States Patent
Bae et al.

(10) Patent No.: US 7,417,859 B2
(45) Date of Patent: Aug. 26, 2008

(54) HEAT RADIATING ASSEMBLY FOR PLASMA DISPLAY APPARATUS AND PLASMA DISPLAY APPARATUS INCLUDING THE SAME

(75) Inventors: Sung-Won Bae, Suwon-si (KR); Ki-Jung Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/329,235

(22) Filed: Jan. 11, 2006

(65) Prior Publication Data

US 2006/0158851 A1    Jul. 20, 2006

(30) Foreign Application Priority Data

Jan. 18, 2005   (KR) ................ 10-2005-0004464

(51) Int. Cl.
  *H05K 5/00*   (2006.01)
  *H05K 7/20*   (2006.01)
  *F28F 7/00*   (2006.01)

(52) U.S. Cl. .............. 361/710; 361/703; 361/714; 361/687; 174/15.2; 165/80.2; 165/80.4

(58) Field of Classification Search ........ 361/679, 361/681, 687–688, 702–704, 717–719, 752, 361/701, 711–713, 700, 709, 697, 710, 714; 345/60; 313/584; 257/684; 165/104.33, 165/80.2, 80.4; 174/15.2
See application file for complete search history.

(56) References Cited

U.S. PATENT DOCUMENTS

| | | | | |
|---|---|---|---|---|
| 5,764,483 A * | 6/1998 | Ohashi et al. | ............... | 361/699 |
| 5,990,618 A * | 11/1999 | Morita et al. | ............... | 313/582 |
| 6,275,220 B1 * | 8/2001 | Nitta | ............... | 345/204 |
| 6,373,702 B2 * | 4/2002 | Oishi et al. | ............... | 361/704 |
| 6,477,039 B2 * | 11/2002 | Tajima | ............... | 361/681 |
| 6,522,543 B2 * | 2/2003 | Kurihara et al. | ............. | 361/704 |
| 6,703,702 B2 * | 3/2004 | Inoue et al. | ............... | 257/684 |
| 6,735,084 B1 * | 5/2004 | Choi et al. | ............... | 361/704 |
| 6,744,186 B2 * | 6/2004 | Oishi et al. | ............... | 313/46 |
| 6,774,872 B1 * | 8/2004 | Kawada et al. | ............... | 345/60 |
| 6,989,817 B2 * | 1/2006 | Tajima | ............... | 345/156 |
| 7,064,952 B1 * | 6/2006 | Chen et al. | ............... | 361/681 |
| 7,164,586 B2 * | 1/2007 | Lin | ............... | 361/714 |

(Continued)

FOREIGN PATENT DOCUMENTS

JP    2000338904 A  * 12/2000

(Continued)

*Primary Examiner*—Anatoly Vortman
*Assistant Examiner*—Bradley H Thomas
(74) *Attorney, Agent, or Firm*—Lee & Morse, P.C.

(57) ABSTRACT

A heat radiating assembly employable by a plasma display apparatus for radiating heat generated by a signal transmission unit, which transmits electric signals from a circuit unit that drives a plasma display panel and includes an electronic device covered by a protecting member, is provided. The heat radiating assembly may include a heat absorbing member, a heat radiating member, and a heat transferring member. The heat absorbing member may absorb the heat generated by the electronic device and transmitted to the protecting member. The heat radiating member may radiate heat out from the plasma display apparatus. The heat transferring member may transfer the heat from the heat absorbing member to the heat radiating member.

22 Claims, 7 Drawing Sheets

U.S. PATENT DOCUMENTS

| | | | |
|---|---|---|---|
| 7,167,365 B2 * | 1/2007 | Fu et al. | 361/697 |
| 7,176,564 B2 * | 2/2007 | Kim | 257/714 |
| 7,215,549 B2 * | 5/2007 | Kim | 361/704 |
| 7,254,031 B2 * | 8/2007 | Kim et al. | 361/717 |
| 2003/0128511 A1 * | 7/2003 | Nagashima et al. | 361/687 |
| 2004/0037039 A1 * | 2/2004 | Shimura et al. | 361/700 |
| 2004/0085737 A1 * | 5/2004 | Choi et al. | 361/719 |
| 2004/0196628 A1 * | 10/2004 | Hisano et al. | 361/689 |
| 2004/0264130 A1 * | 12/2004 | Liang | 361/690 |
| 2005/0051888 A1 * | 3/2005 | Kim | 257/706 |
| 2005/0078446 A1 * | 4/2005 | Bae | 361/687 |
| 2005/0083646 A1 * | 4/2005 | Bae et al. | 361/686 |
| 2005/0088092 A1 * | 4/2005 | Kim et al. | 313/582 |
| 2005/0088820 A1 * | 4/2005 | Nagawana et al. | 361/697 |
| 2005/0093140 A1 * | 5/2005 | Kim | 257/714 |
| 2005/0116644 A1 * | 6/2005 | Kim et al. | 313/582 |
| 2005/0117293 A1 * | 6/2005 | Yokoyama | 361/688 |
| 2005/0117304 A1 * | 6/2005 | Kim | 361/704 |
| 2005/0124221 A1 * | 6/2005 | Lin | 439/620 |
| 2005/0259401 A1 * | 11/2005 | Han et al. | 361/704 |
| 2006/0018092 A1 * | 1/2006 | Nagano | 361/687 |
| 2006/0032617 A1 * | 2/2006 | Chen et al. | 165/104.33 |
| 2006/0050481 A1 * | 3/2006 | You | 361/688 |
| 2006/0077619 A1 * | 4/2006 | Kim et al. | 361/679 |
| 2006/0126300 A1 * | 6/2006 | Chang et al. | 361/704 |
| 2006/0151153 A1 * | 7/2006 | Chen | 165/104.26 |
| 2006/0170349 A1 * | 8/2006 | Kim | 313/582 |
| 2006/0187641 A1 * | 8/2006 | Shin | 361/704 |

FOREIGN PATENT DOCUMENTS

| | | |
|---|---|---|
| JP | 2004309545 A * | 11/2004 |
| KR | 10-2005-0023013 | 3/2005 |

* cited by examiner

HEAT RADIATING ASSEMBLY FOR PLASMA DISPLAY APPARATUS AND PLASMA DISPLAY APPARATUS INCLUDING THE SAME

BACKGROUND OF THE INVENTION

1. Field of the Invention

The invention relates to a heat radiating assembly for a plasma display apparatus and a plasma display apparatus including the same. More particularly, the invention relates to a heat radiating assembly capable of efficiently radiating heat generated by electronic elements disposed on a signal transmission unit and a plasma display apparatus including the heat radiating assembly.

2. Description of the Related Art

Plasma display apparatuses are flat panel display apparatuses that display images using a gas discharge phenomenon. Plasma display apparatuses have superior characteristics such as high image quality, small thickness, low weight, and wide viewing angle with large screens. Plasma display apparatuses of various sizes, including large sizes, are generally easy to fabricate.

In general, plasma display apparatuses include a plasma display panel, a frame disposed parallel to the plasma display panel, a circuit unit mounted on a rear portion of the frame to drive the plasma display panel, and a case that houses the plasma display panel, the frame, and the circuit unit.

In the plasma display panel, the circuit unit and the plasma display panel are electrically connected to each other by a signal transmission unit such as a tape carrier package (TCP) or a chip on film (COF). TCPs are formed by mounting a device such as a driving integrated circuit (IC) on a tape and packaging. COFs are formed by mounting a device on a film forming a flexible printed circuit (FPC). TCPs and COFs are flexible, and a plurality of devices can be mounted on each. By mounting a plurality of devices on each, a size of a circuit unit can be reduced.

Electronic devices mounted on the TCP or COF generate high temperature heat during driving of the plasma display panel. If the heat cannot be radiated sufficiently, the electronic devices may operate improperly, and cause problems when images are to be displayed on the plasma display panel. When the plasma display panel is driven in a high definition (HD) single scan method, the electronic devices mounted on the TCP or COF connecting the address driver of the circuit unit and the address electrodes generate even more heat than usual. The generated heat should be radiated to help maintain proper function of the plasma display panel.

SUMMARY OF THE INVENTION

The invention is therefore directed to a heat radiating assembly for a plasma display apparatus, which substantially overcomes one or more of the problems due to the limitations and disadvantages of the related art.

It is therefore a feature of embodiments of the invention to provide a heat radiating assembly for a plasma display apparatus having improved heat radiation performance, and a plasma display apparatus including the assembly.

At least one of the above and other features and advantages of the invention may be realized by providing a heat radiating assembly employable by a plasma display apparatus for radiating heat generated by a signal transmission unit, which transmits electric signals from a circuit unit that drives a plasma display panel and includes an electronic device covered by a protecting member. The heat radiating assembly may include a heat absorbing member absorbing heat generated by the electronic device and transmitted to the protecting member, a heat radiating member radiating heat out from the plasma display apparatus, and a heat transferring member transferring the heat from the heat absorbing member to the heat radiating member.

The heat absorbing member may include a base portion. At least one of the heat absorbing member and the heat radiating member includes a plurality of fins. The heat transferring member may be a heat pipe. The portion of the heat pipe may be inserted into the base portion of the heat absorbing member to a predetermined depth. The fins may be plate-like members arranged parallel to each other at predetermined intervals.

The base portion of the heat absorbing member, the heat radiating member, and the signal transmission unit may include holes that are coaxially formed so that the base, the heat radiating member, and the signal transmission unit can be integrally coupled to each other by screws inserted into the holes. The heat radiating member may include the plurality of fins and the plurality of fins may be penetrated by the heat pipe. The heat radiating member may include a base portion and a plurality of fins disposed on the base portion. A heat releasing portion of the heat transferring member may be at least one of inserted into the base portion of the heat radiating member to a predetermined depth and arranged to be in contact with the base portion of the heat radiating member. The protecting member may include a recess portion that receives the electronic device.

At least one of the above and other features and advantages of the invention may be realized by providing a plasma display apparatus that includes a plasma display panel, a frame supporting the plasma display panel, a circuit unit disposed at a side of the frame and generating electric signals to drive the plasma display panel, a plurality of signal transmission units transmitting the electric signals from the circuit unit to the plasma display panel, each signal transmission unit including at least one electronic device arranged thereon, and the plurality of signal transmission units being arranged separate from each other, a protecting member covering the electronic devices, and a heat radiating assembly. The heat radiating assembly may include a heat absorbing member absorbing heat generated by the electronic devices and transmitted to the protecting member, a heat radiating member radiating heat out from the plasma display apparatus, and a heat transferring member transferring the heat from the heat absorbing member to the heat radiating member.

BRIEF DESCRIPTION OF THE DRAWINGS

The above and other features and advantages of the invention will become more apparent to those of ordinary skill in the art by describing in detail exemplary embodiments thereof with reference to the attached drawings in which.

DETAILED DESCRIPTION OF THE INVENTION

Figure 1:
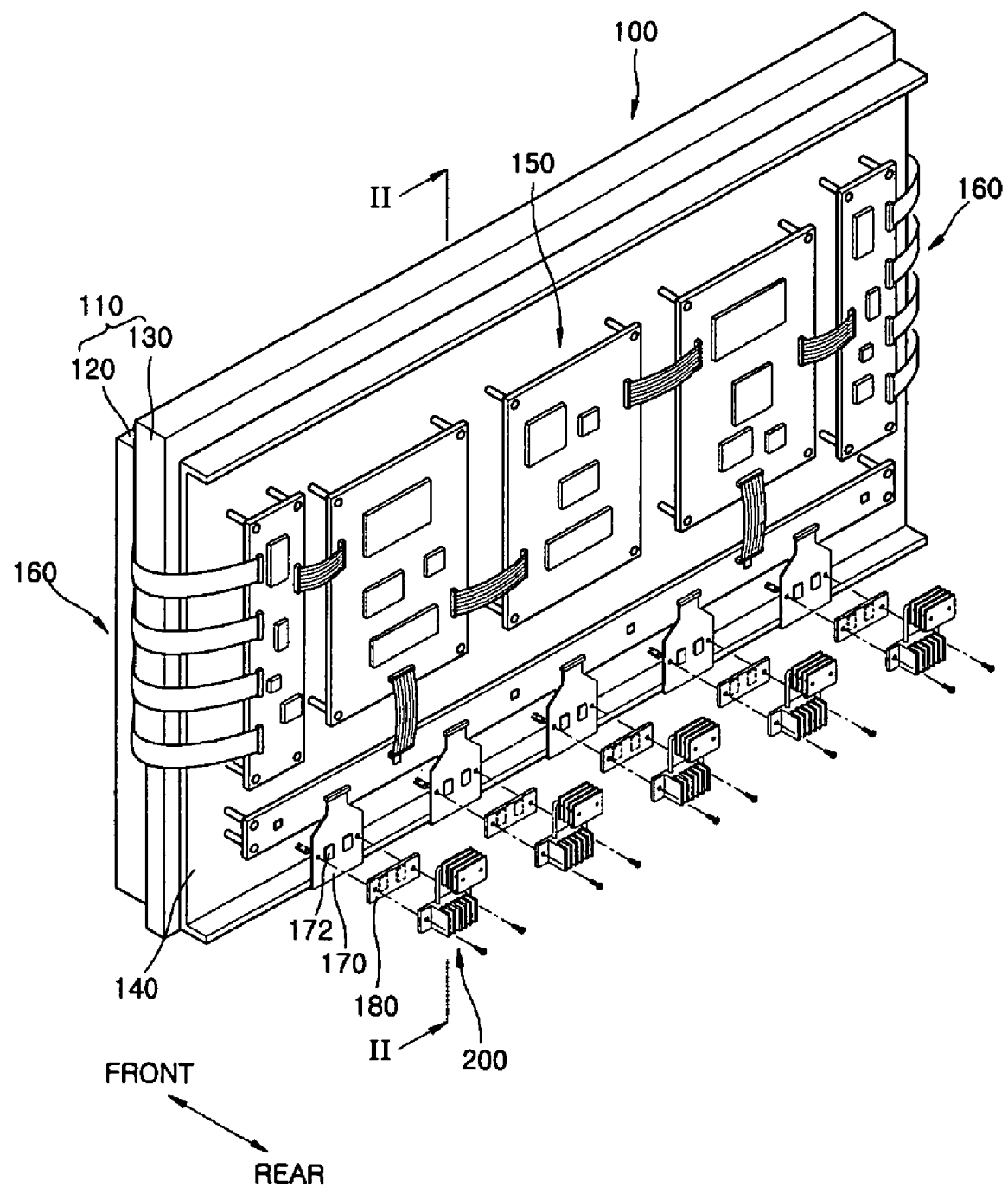
FIG. 1 illustrates an exploded perspective view of a plasma display apparatus according to an embodiment of the invention.

Korean Patent Application No. 10-2005-0004464, filed on Jan. 18, 2005, in the Korean Intellectual Property Office, and entitled: "Heat Radiating Assembly for Plasma Display Apparatus and Plasma Display Apparatus Comprising the Same," is incorporated herein by reference in its entirety.

The invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. Like reference numerals refer to like elements throughout.

Figure 2:
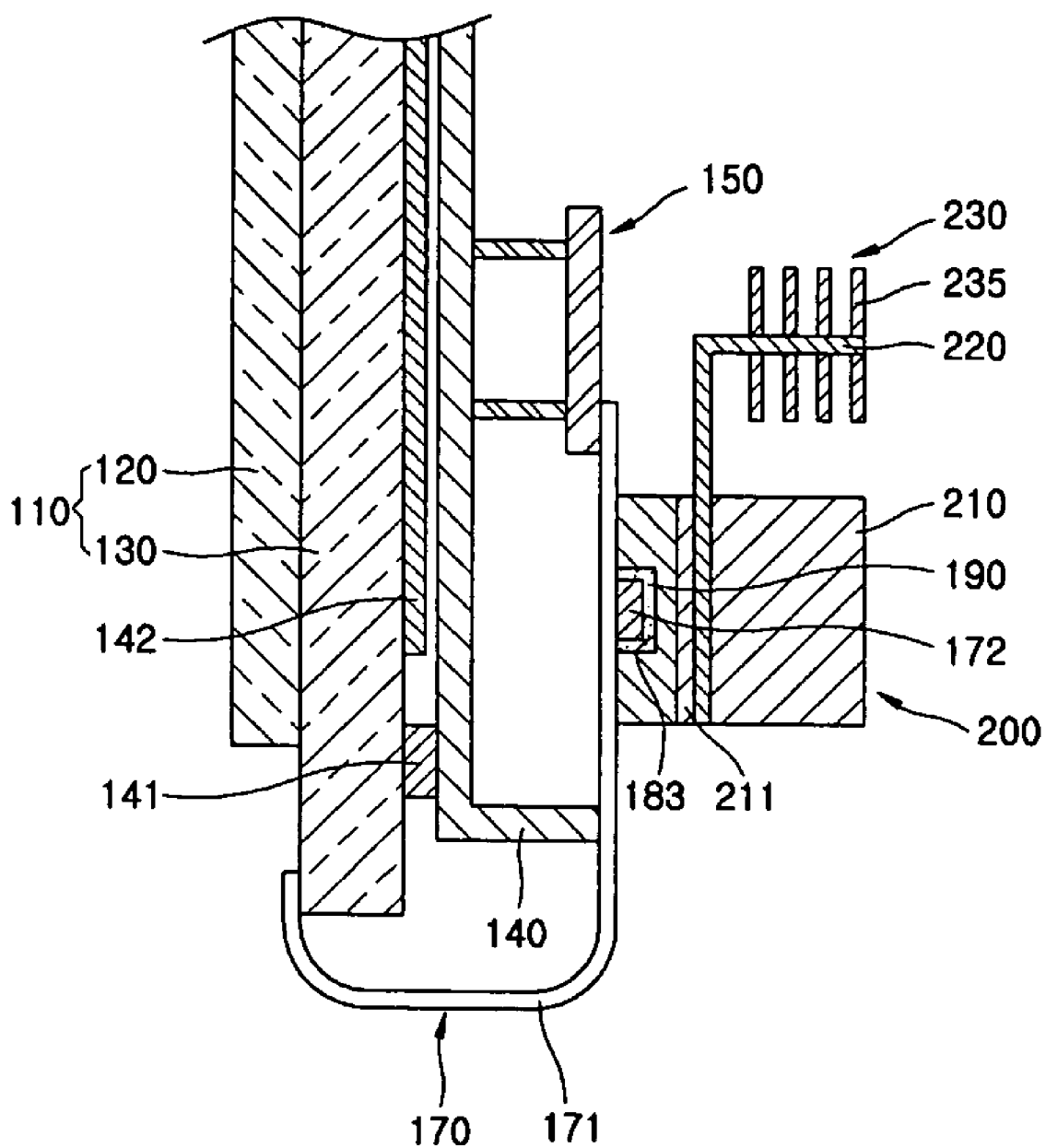
FIG. 2 illustrates a cross-sectional view along line II-II of the plasma display apparatus shown in FIG. 1.

FIG. 1 illustrates an exploded perspective view of a plasma display apparatus according to an embodiment of the invention. FIG. 2 illustrates a cross-sectional view along line II-II of the plasma display apparatus illustrated in FIG. 1.

As shown in FIG. 1, a plasma display apparatus 100 may include a plasma display panel 110 that is capable of displaying images by discharge of a gas contained therein. Various kinds of plasma display panels can be used as the plasma display panel 110. For example, an alternating current (AC) plasma display panel having a surface discharge three-electrode structure as shown in FIG. 3 may be used.

Figure 3:
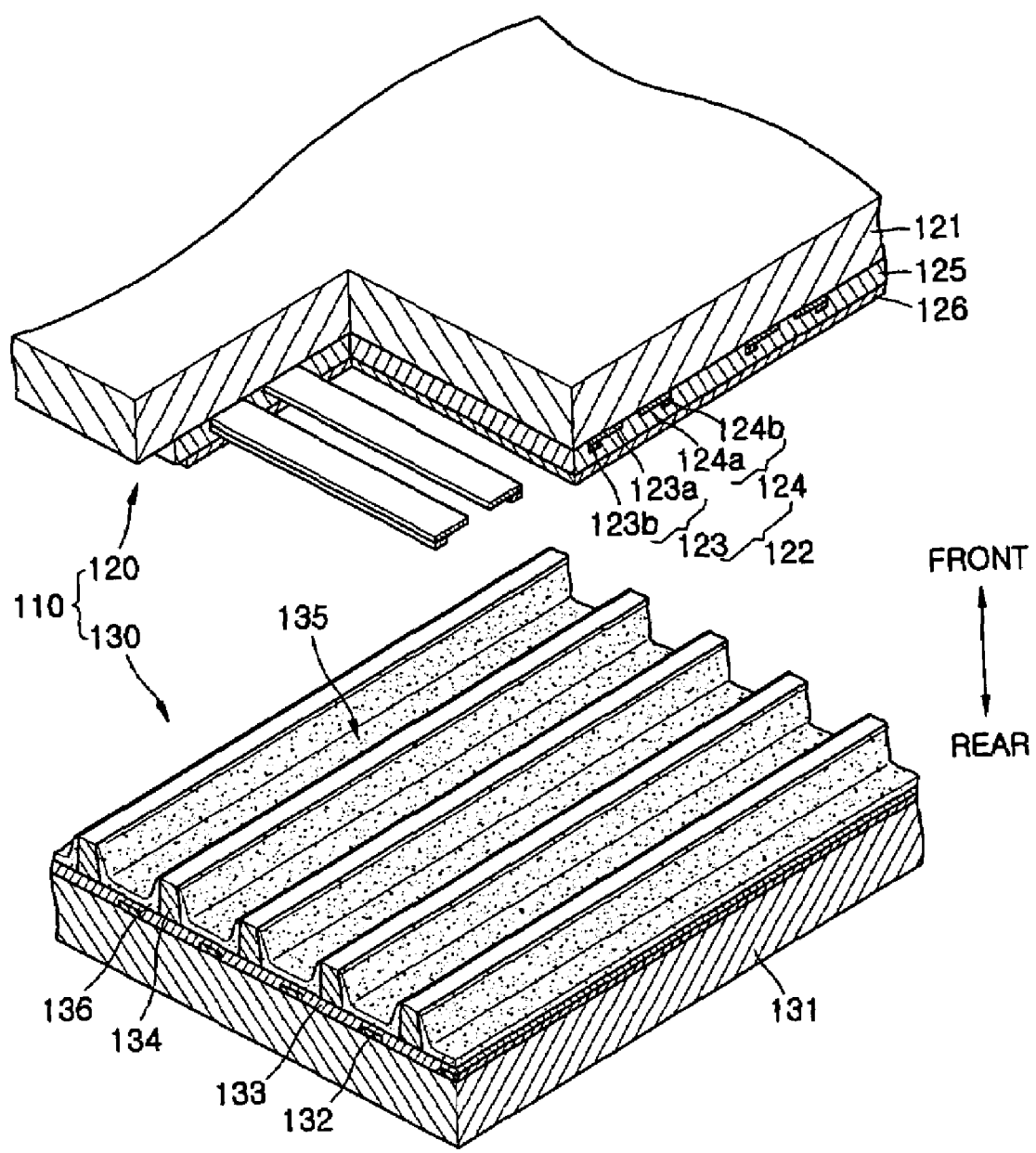
FIG. 3 illustrates a partial perspective view of the plasma display apparatus shown in FIG. 1.

As shown in FIGS. 1-3, the plasma display panel 110 may include a front panel 120, and a rear panel 130. The front panel 120 and the rear panel 130 may be arranged to face each other and may define a predetermined space between each other.

As shown in detail in FIG. 3, the front panel 120 may include a front substrate 121, pairs of sustain electrodes 122 formed on a rear surface of the front substrate 121, a front dielectric layer 125 covering the pairs of sustain electrodes 122, and a protective layer 126 (e.g., MgO layer) formed on a rear surface of the front dielectric layer 125. Each pair of sustain electrodes 122 may include an X electrode 123 and a Y electrode 124. The X electrode 123 and the Y electrode 124 may function as a common electrode and a scan electrode respectively. The X electrode 123 and the Y electrode 124 may be arranged separate from each other with a discharge gap between them. The X electrode 123 may include a X transparent electrode 123a and a X bus electrode 123b connected to the X transparent electrode 123a. The Y electrode 124 may include a Y transparent electrode 124a and a Y bus electrode 124b connected to the Y transparent electrode 124a.

The rear panel 130 may include a rear substrate 131 disposed parallel to the front substrate 121, address electrodes 132 formed on a front surface of the rear substrate 131, a rear dielectric layer 133 covering the address electrodes 132, barrier ribs 134 formed on the rear dielectric layer 133 to define the discharge cells 135, phosphor layers 136 disposed in the discharge cells 135, and a discharge gas filled in the discharge cells 135. The address electrodes 132 may extend along a direction that crosses a direction along which the pairs of sustain electrodes 122 extend.

As shown in FIGS. 1 and 2, a frame 140 that may be fabricated, for example, using a casting or a pressing method may support the plasma display panel 110 and the circuit unit 150. It may be desirable for the frame 140 to be formed of a metal having a high thermal conductivity such as aluminium to efficiently radiate the heat transmitted from the plasma display panel 110. It may be desirable for an edge of the frame 140 to bend backward to help prevent the frame 140 from bending or deforming.

As shown in FIG. 2, the plasma display panel 110 and the frame 140 may be attached to each other using a dual-adhesive tape 141. A thermal conductive sheet 142 having high thermal conductivity may be disposed between the plasma display panel 110 and the frame 140 to disperse the heat that may be locally generated by the plasma display panel 110. The thermal conductive sheet 142 may help transmit some of the heat that may be generated by the plasma display panel 110 to the frame 140. A silicon glass, a silicon heat radiation sheet, an acryl-based heat radiation and decompression adhesive sheet, a urethane-based heat radiation and decompression adhesive sheet, and a carbon sheet may be used as the thermal conductive sheet 142.

Figure 4:
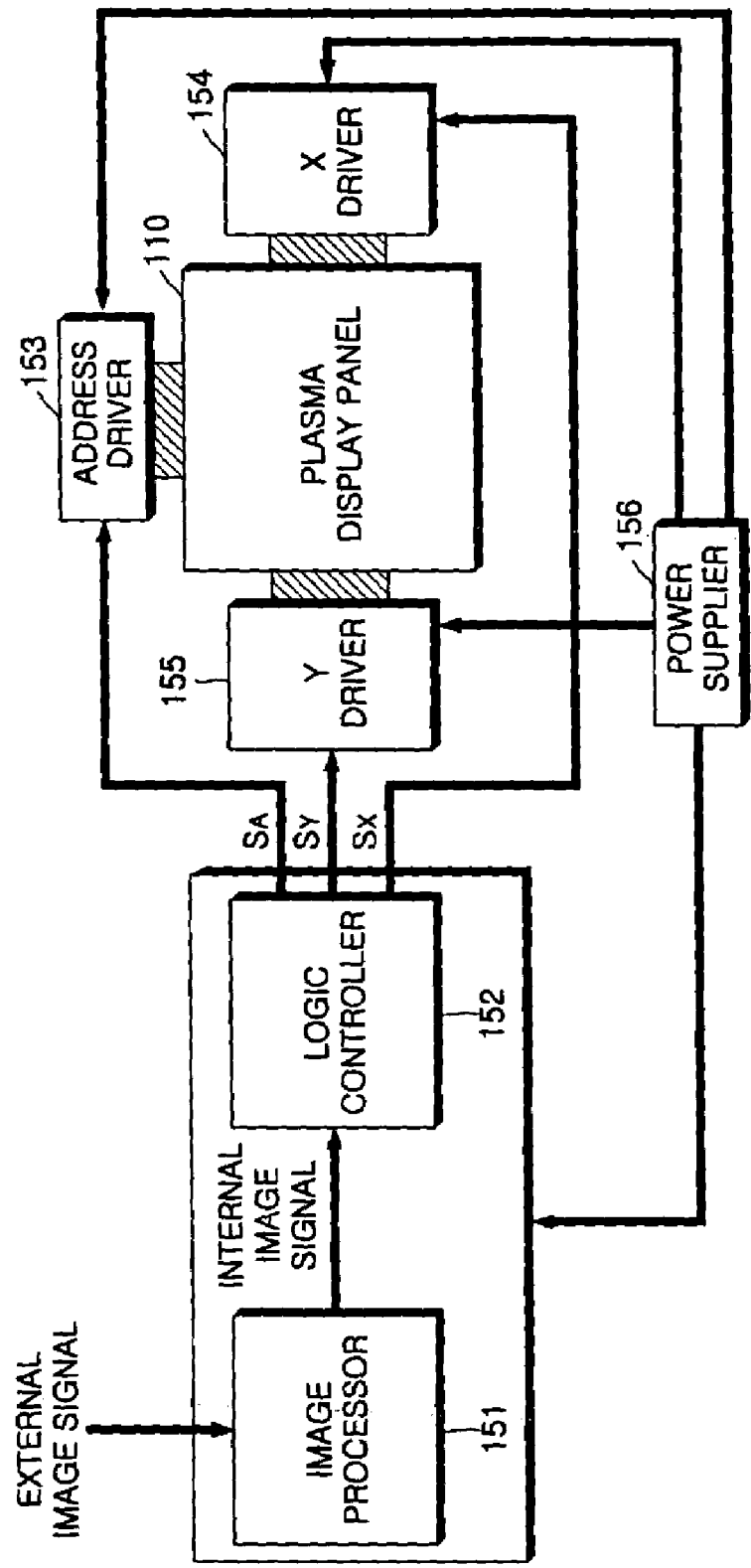
FIG. 4 illustrates a block diagram illustrating operations of a circuit unit of the plasma display apparatus shown in FIG. 1.

The circuit unit 150 may be installed on a rear portion of the frame 140 and may include a plurality of electronic elements. The circuit unit 150 may drive the plasma display panel 110. As shown in FIG. 4, the circuit unit 150 may include an image processor 151, a logic controller 152, an address driver 153, an X driver 154, a Y driver 155, and a power supplier 156.

The image processor 151 may convert an external analog image signal into a digital signal to generate internal image signals, for example, red, green, and blue image data of 8 bits, a clock signal, a vertical synchronization signal, and a horizontal synchronization signal. The logic controller 152 may generate driving control signals $S_A$, $S_Y$, and $S_X$ according to the internal image signal from the image processor 151. The address driver 153 may process an address signal $S_A$ among the driving control signals $S_A$, $S_Y$, and $S_X$ from the logic controller 152 to generate a display data signal, and may apply the generated display data signal to the address electrodes 132.

The X driver 154 may process an X driving control signal $S_X$ among the driving control signals $S_A$, $S_Y$, and $S_X$ from the logic controller 152 and may apply the X driving control signal $S_X$ to the X electrodes 123. The Y driver 155 may process a Y driving control signal $S_Y$ among the driving control signals $S_A$, $S_Y$, and $S_X$ from the logic controller 152 and may apply the Y driving control signal $S_Y$ to the Y electrodes 124. The power supplier 156 may generate an operating voltage required by the image processor 151 and the logic controller 152, and an operating voltage required by the address driver 153, the X driver 154, and the Y driver 155, and may supply the applicable voltage to each of them.

The circuit unit 150 may transmit electric signals to the plasma display panel 110 by signal transmission units. The signal transmission unit may be a flexible printed cable (FPC), a tape carrier package (TCP), or a chip on film (COF). In embodiments of the invention, as shown in FIG. 1, FPCs 160 may be disposed on left and right sides of the frame 140 as signal transmission units. TCPs 170 may be formed by mounting one or more electronic devices 172 on a wiring unit 171. The wiring unit 171 may have a tape-like shape. The TCPs 170 may be disposed on a lower portion of the frame 140 as signal transmission units. The TCPs 170 may be arranged separate from each other, with predetermined intervals between them, on a lower portion of the frame 140, as shown in FIG. 1.

In embodiments, the circuit unit 150 may be formed to drive the plasma display panel 110 in a high-definition (HD) single scan method. The TCPs 170 may transmit the electric signals generated by the address driver 153 of the circuit unit 150 to the address electrodes 132. The wiring units 171 of the TCPs 170 may wrap around a lower edge of the frame 140 and a lower edge of the rear panel 130. An end portion of the wiring units 171 may be respectively connected to the address electrodes 132 formed on the plasma display panel 110. Other end portions of the wiring units 171 may be connected to the address driver 153 of the circuit unit 150. Electronic devices 172, e.g., an address driving integrated circuit (IC), may be mounted on each of the wiring units 171 of the TCP 170. The electronic devices 172 may be disposed on a portion of the wiring units 171 that overlap a rear side of the frame 140.

The electronic devices 172 of the TCPs 170 may be respectively covered by protecting members 180. In embodiments, the protecting members 180 may be arranged in one-to-one correspondence with the TCPs 170. In embodiments, a common protecting member may cover a plurality of TCPs 170 or all the TCPs 170.

Figure 5:
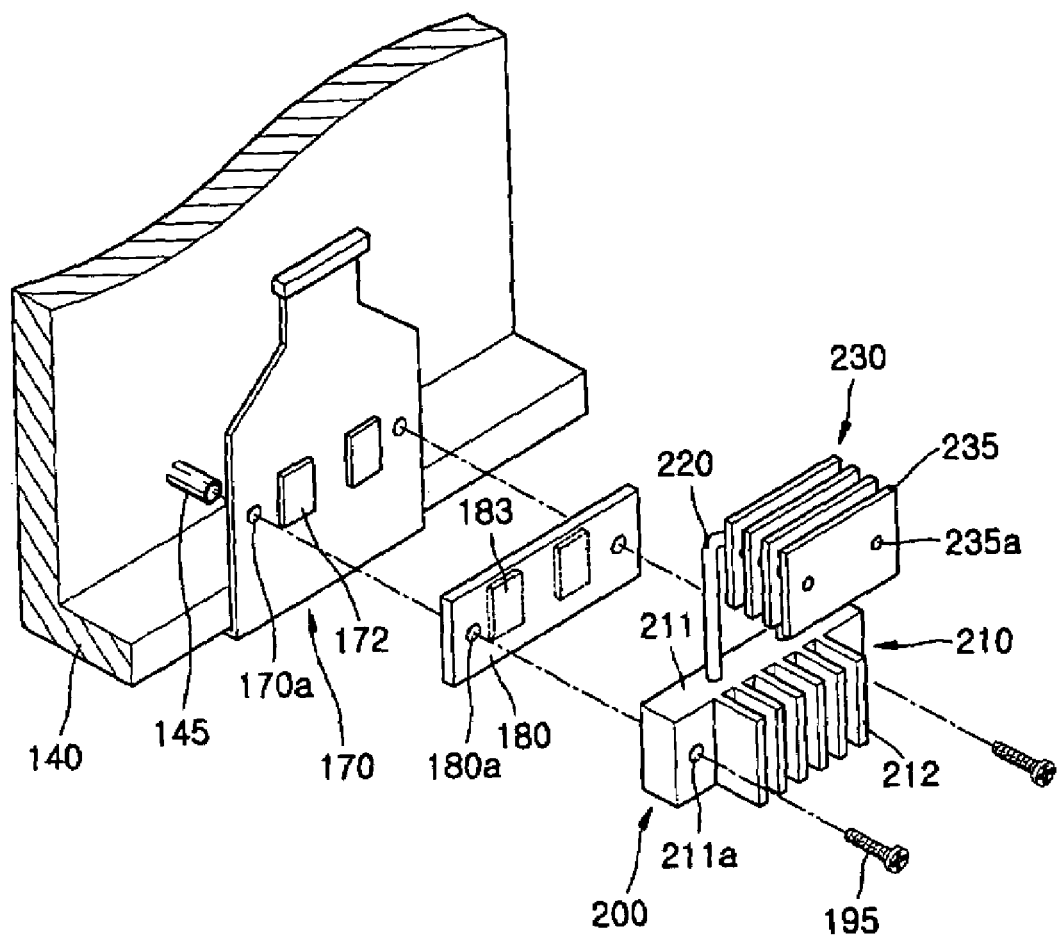
FIG. 5 illustrates an exploded perspective view of an exemplary embodiment of a heat radiating assembly employing one or more aspects of the invention.

Referring to FIGS. 2 and 5, the electronic devices 172 may protrude from the wiring units 171 toward the protecting member 180. The protecting member 180 may have recess portions 183 that respectively receive the electronic devices 172. The protecting members 180 may cover the electronic devices 172 and thereby protect the electronic devices 172. When the protecting members 180 are arranged on the plasma display panel 110, a space exist may exist between facing respective surfaces of the recess portions 183 of the protecting members 180 and the electronic devices 172. The shape of the recess portions of the protecting members 180 is not limited to the above example. For example, the protecting members 180 may have recess portions that receive two electronic devices together.

A thermal conductive medium 190 may be disposed between the electronic devices 172 and the recess portions 183. More particularly, the thermal conductive medium 190 may be disposed between respective facing surfaces of the electronic devices 172 and the recess portions 183. The thermal conductive medium 190 may help transmit the heat generated by the electronic devices 172 to the respective protecting members 180. The thermal conductive medium 190 may help prevent the electronic devices 172 from being damaged. In embodiments, the thermal conductive medium 190 may be a liquid or gel that is capable of transmitting heat. A thermal grease may be used as the thermal conductive medium 190. The thermal grease may be fabricated by adding metallic soap and a small amount of water to a liquid mineral oil and mixing the metallic soap, the water and the liquid mineral oil to a colloid state with a predetermined viscosity. The thermal grease may include a synthetic oil such as silicon oil instead of the mineral oil.

The liquid or gel type thermal conductive medium 190 may be filled completely between the respective recess portions 183 of the protecting members 180 and the electronic devices 172. The heat generated by the electronic devices 172 may be transmitted to the respective protecting member 180 through the thermal conductive medium 190. It may be desirable for the thermal conductive medium 190 to have a viscosity that helps maintain the thermal conductive medium 190 between the recess portions 183 and the respective electronic devices 172 when the plasma display apparatus 100 is oriented vertically.

FIG. 5 illustrates a perspective view of a heat radiating assembly 200. As shown in FIG. 1, heat radiating assemblies 200 may be respectively disposed on the protecting members 180. As shown in FIG. 5, the heat radiating assembly 200 may include a heat absorbing member 210, heat pipes 220, and a heat radiating member 230. In embodiments, the protecting members 180 may be integrally formed with the heat absorbing member 210.

The heat radiating assembly 200 having the above excmplaiy structure may be coupled to the frame 140 as follows. One or more holes 170a may be formed on the TCP 170. The holes 170a may be symmetrically formed on the TCP 170 near the side surfaces of the electronic devices 172. The heat radiating assembly may respectively include holes 180a and/or 211a on the protecting member(s) 180 covering the respective electronic device(s) 172 of the TCP 170 and/or on the heat absorbing member 210. The holes 211a that may be provided on the heat absorbing member 210 may be formed on the base 211. In embodiments, the holes 211a may be formed on the base 211 on each side of the fins 212. The holes 211a on the base 211 may extend along a direction that extends from a side of the base 211 that includes the fins 212 towards a side of the base 211 that faces the protecting member 180. The holes 170a, 180a, and 211a may be respectively provided on the TCP 170, the protecting member 180, and the base 211 of the heat absorbing member 210 may be coaxially formed. Bosses 145 may be disposed on the frame 140 at portions corresponding to the holes 170a of the TCP 170. The bosses 145 may include threads therein, and may have a predetermined length. The bosses 145 may help support the TCPs 170 at a predetermined distance away from the frame 140. Screws 195 may be inserted through the holes 170a, 180a, and 211a and may be coupled to the bosses 145 to couple the TCP 170, the protecting member 180, and the heat radiating assembly 200 to the frame 140.

One or more heat pipes 220 (e.g., two heat pipes) may be included in each heat radiating assembly 200. The heat radiating members 230 may be arranged separate from the heat absorbing member 210. The heat pipes 220 may connect respective ones of the heat absorbing members 210 and the heat radiating members 230. The heat pipes 220 may transmit the heat from the heat absorbing member 210 to the heat radiating member 230. In embodiments, other known heat transfer devices may be used instead of or in combination with the exemplary heat pipes 220.

Figure 6:
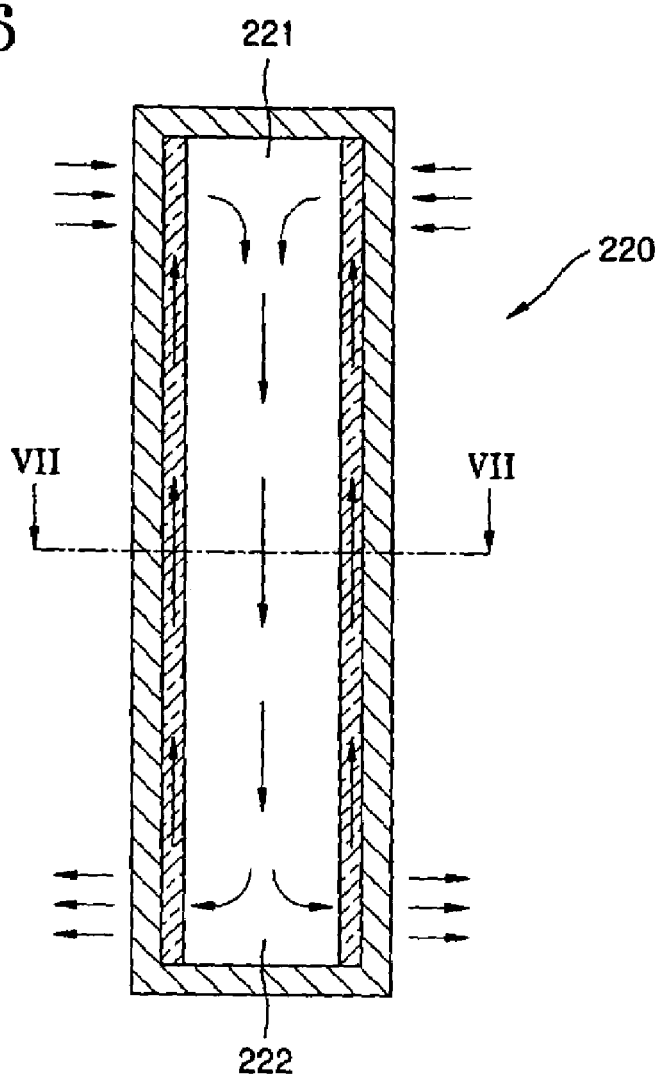
FIG. 6 illustrates a cross-sectional view of a heat pipe adopted by the heat radiating assembly shown in FIG. 5.
Figure 7:
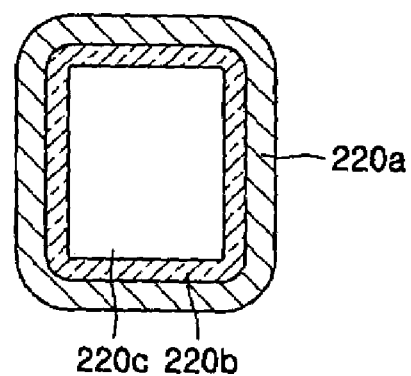
FIG. 7 illustrates a cross-sectional view along line VII-VII of the heat pipe shown in FIG. 6.

FIG. 6 illustrates an exemplary heat pipe that may be employed by embodiments of the invention. FIG. 7 illustrates a cross-sectional view, along line VII-VII, of the heat pipe shown in FIG. 6. Straight or bent heat pipe(s) may be employed by embodiments of the invention. A bent heat pipe may function the same as a straight heat pipe. As shown in FIGS. 6 and 7, the heat pipe 220 may include a body 220a that defines a closed space that includes a portion that may function as a condensing section 222 and a portion that may function as an evaporating section 221. A wick 220b may be housed in a space defined by the body 220a. Operating fluid 220c may be provided in the closed space defined by the body 220a. The wick 220b may be arranged in the outer pipe 220a to help move the operating fluid 220c from the condensing section 222 of the heat pipe 220 toward the evaporating section 221 of the heat pipe 220 by capillary action. The wick 220b may be in the form of a net. The operating fluid 220c used in the heat pipe 220 may be methanol, alcohol or distilled water. In embodiments, the operating fluid 220c may be a fluid that is volatile at or below room temperature. In embodiments, the operating fluid 220c may be a fluid that absorbs energy when changing phase.

In embodiments, the operating fluid 220c may evaporate at the portion of the heat pipe 220 that is functioning as the evaporating section 221 when the evaporating section 221 is subjected to high temperature (e.g., when the evaporating section 221 is in contact with a hot member). For example, when the base 211 is heated as a result of the heat generated from driving the plasma display panel 110, the operating fluid 220c at the evaporating section 221 may change from a liquid phase to a vapor phase. When the operating fluid 220c changes from a liquid phase to a vapor phase, the operating fluid 220c absorbs heat. The evaporating operating fluid 220c may then fill a hollow center portion of the wick 220b and be transferred from the evaporating section 221 to the condensing section 222. At the condensing section 222, which is at a lower temperature than the evaporating section, the evaporated operating fluid 220c may condense. As the operating fluid 220c condenses, the operating fluid 220c may release the heat that the operating fluid 220c acquired when it changed from a liquid phase to a vapor phase at the evaporating section 221. The operating fluid 220c that changed from a vapor phase to a liquid phase at the condensing section 222 is transferred via capillary action of the wick 220b from the condensing section 222 to the evaporating section 221. The process may repeat and heat may be transferred from the base 211 to the heat radiating member 230. The heat pipe 220 may have a thermal conductivity about 10,000 W/mK, which is about 2000 times larger than the thermal conductivity of copper.

In embodiments, a side of the heat pipe 220 that has high thermal conductivity may be inserted into the side surface of the base 211 of the heat absorbing member 210 to a predetermined depth. The insertion depth of the heat pipe 220 may be set variously. It may be desirable for the heat pipe 220 to be inserted as deep as possible into the base 211, as shown in FIG. 2. It may be possible to increase the heat exchanging area between the base 211 of the heat absorbing member 210 and the evaporating section 221 of the heat pipe by increasing a depth to which the heat pipe is inserted into the base 211. The portion of heat pipe 220 inserted into the base 211 may function as the evaporating section 221.

The other end portion of the heat pipe 220 may be thermally connected to the heat radiating member 230. The heat radiating member 230 may include rectangular plate-like members 235 arranged parallel to each other at predetermined intervals. One or more holes 235a may be formed on each plate-like members 235 so that the heat pipe(s) 220 can penetrate through the plate-like members 235. The condensing section 222 of the heat pipe(s) 220 may work with the heat radiating member 230 to radiate the heat that is released when the operating fluid 220c changes from the vapor phase to the liquid phase. The heat radiating member 230 helps increase the heat radiating area of the condensing section 222 of the heat pipe 220, and thus, the heat transferred from the heat absorbing member 210 through the heat pipe 220 can be radiated to away from the plasma display apparatus 100 by the heat radiating member 230. The heat radiating member 230 may be integrally formed with the heat pipe 220.

The heat radiating assembly 200 having the above exemplary structure may be coupled to the frame 140 as follows. One or more holes 170a may be formed on the TCP 170. The holes 170a may be symmetrically formed on the TCP 170 near the side surfaces of the electronic devices 172. The heat radiating assembly may respectively include holes 180a and/ or 211a on the protecting member(s) 180 covering the respective electronic device(s) 172 of the TCP 170 and/or on the heat absorbing member 210. The holes 211a that may be provided on the heat absorbing member 210 may be formed on the base 211. In embodiments, the holes 211a may be formed on the base 211 on each side of the fins 212. The holes 211a on the base 211 may extend along a direction that extends from a side of the base 211 that includes the fins 212 towards a side of the base 211 that faces the protecting member 180. The holes 170a, 180a, and 211a may be respectively provided on the TCP 170, the protecting member 180, and the base 211 of the heat absorbing member 210 may be coaxially formed. Bosses 145 may be disposed on the frame 140 at portions corresponding to the holes 170a of the TCP 170. The bosses 145 may include threads therein, and may have a predetermined length. The bosses 145 may help support the TCPs 170 at a predetermined distance away from the chassis 140. Screws 195 may be inserted through the holes 170a, 180a, and 211a and may be coupled to the bosses 145 to couple the TCP 170, the protecting member 180, and the heat radiating assembly 200 to the frame 140.

Figure 8:
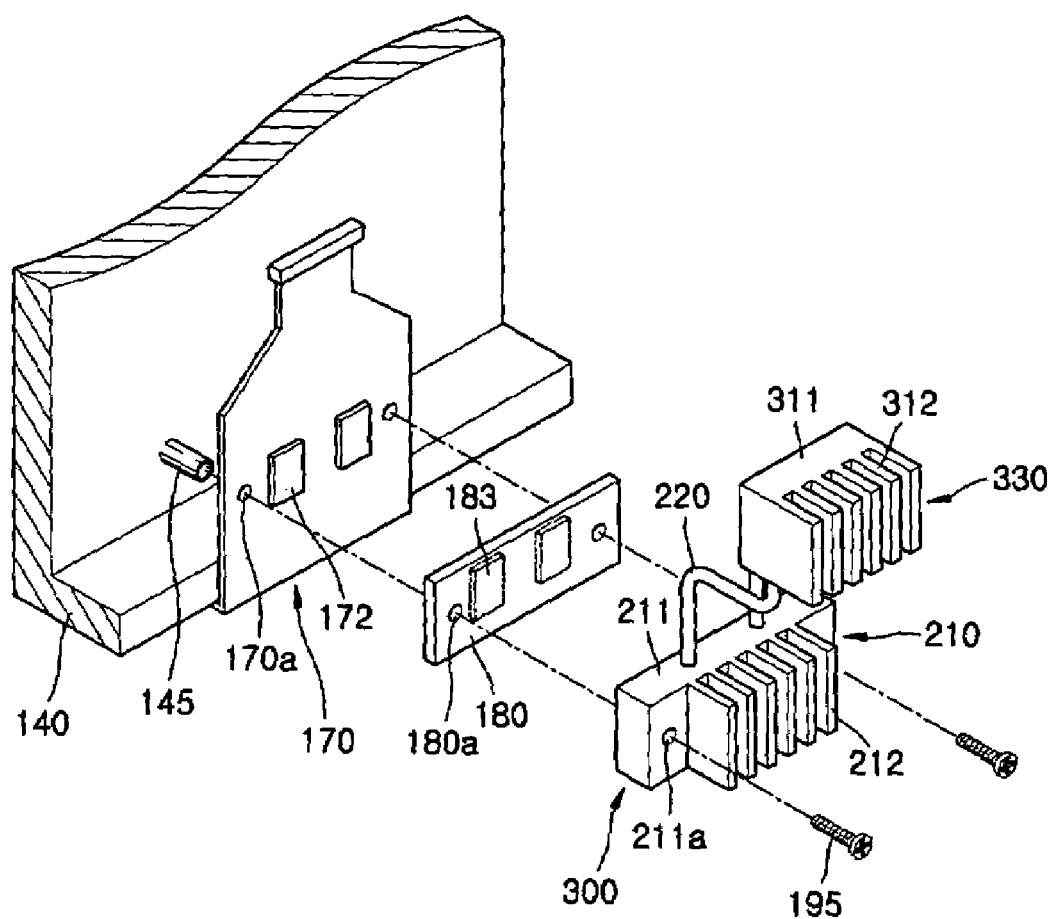
FIG. 8 illustrates an exploded perspective view of another exemplary embodiment of a heat radiating assembly employing one or more aspects of the invention.

FIG. 8 shows another embodiment of a heat radiating assembly 300 employing one or more aspects of the invention. Like reference numerals refer to like elements throughout the description.

In the embodiment illustrated in FIG. 8, a heat radiating member 330 is provided. As discussed above, the heat pipes 220 may be straight or bent pipes. A heat radiating assembly 300 may include the heat absorbing member 210, the heat pipes 220, and the heat radiating member 330. The heat radiating member 330 may include a base 311, and fins 312. The fins 312 may have a rectangular plate-like shape. The fins 312 may be arranged on the base 311 at predetermined intervals. An end portion of the heat pipes 220 may be inserted into the base 311 of the heat radiating member 330 to a predetermined depth. The predetermined depth to which the heat pipes 220 may be inserted can be set variously. It may be desirable for the heat pipe(s) 220 to be inserted as deep as possible into the base 311. A heat transfer area between the base 311 of the heat absorbing member 210 and the heat pipe(s) 220 may be increased by inserting the heat pipe(s) 220 deeper into the base 311. The portion of heat pipe 220 inserted into the base 211 may function as the evaporating section 221. In embodiments, a heat transfer efficiency of the heat radiating assembly 300 may be improved by increasing a contacting area between the heat pipes 220 and the heat radiating member 330. When the TCPs 170 are cooled down using a heat radiating assembly 300 having the above structure, the heat generated by the electronic device(s) 172, which may be mounted on the TCPs 170, may be radiated efficiently.

One or more aspects of the invention provide a plasma display apparatus having improved heat radiating efficiency for radiating heat generated by electronic devices of a signal transmission unit.

Exemplary embodiments of the invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A heat radiating assembly employable by a plasma display apparatus for radiating heat generated by a signal transmission unit, which transmits electric signals from a circuit unit that drives a plasma display panel and includes an electronic device covered by a protecting member, the heat radiating assembly comprising:

a heat absorbing member including a base portion to absorb heat generated by the electronic device and transmitted to the protecting member;

a heat radiating member radiating heat out from the plasma display apparatus; and a heat transferring member transferring the heat from the heat absorbing member to the heat radiating member, wherein a portion of the heat transferring member extends into the heat absorbing member, and the base portion separates the heat transferring member from the protecting member.

2. The assembly according to claim 1, wherein at least one of the heat absorbing member and the heat radiating member includes a plurality of fins.

3. The assembly according to claim 2, wherein the heat transferring member is a heat pipe.

4. The assembly according to claim 3, wherein the heat pipe is inserted into the base portion of the heat absorbing member to a predetermined depth.

5. The assembly according to claim 2, wherein the fins are plate-like members arranged parallel to each other at predetermined intervals.

6. The assembly according to claim 2, wherein the base portion of the heat absorbing member, the heat radiating member, and the signal transmission unit include holes that are coaxially formed so that the base portion of the heat absorbing member, the heat radiating member, and the signal transmission unit can be integrally coupled to each other by screws inserted into the holes.

7. The assembly according to claim 3, wherein the heat absorbing member includes the plurality of fins arranged on the base portion of the heat absorbing member.

8. The assembly according to claim 3, wherein the heat radiating member includes the plurality of fins, the plurality of fins being penetrated by the heat pipe.

9. The assembly according to claim 1, wherein the heat radiating member includes a plurality of fins disposed on the base portion.

10. The assembly according to claim 9, wherein a heat releasing portion of the heat transferring member is at least one of inserted into the base portion of the heat radiating member to a predetermined depth and arranged to be in contact with the base portion of the heat radiating member.

11. The assembly according to claim 1, wherein the protecting member includes a recess portion that receives the electronic device.

12. A plasma display apparatus, comprising:
a plasma display panel;
a frame supporting the plasma display panel;
a circuit unit disposed at a side of the frame and generating electric signals to drive the plasma display panel;
a plurality of signal transmission units transmitting the electric signals from the circuit unit to the plasma display panel, each signal transmission unit including at least one electronic device arranged thereon, and the signal transmission units being arranged separate from each other;
a protecting member covering the at least one electronic device; and
a heat radiating assembly including:
a heat absorbing member including a base portion to absorb heat generated by the at least one electronic device and transmitted to the protecting member,
a heat radiating member radiating heat out from the plasma display apparatus, and
a heat transferring member transferring the heat from the heat absorbing member to the heat radiating member,
wherein a portion of the heat transferring member extends into the heat absorbing member, and the base portion separates the heat transferring member from the protecting member.

13. The apparatus according to claim 12, wherein at least one of the heat absorbing member and the heat radiating member includes a plurality of fins.

14. The apparatus according to claim 13, wherein the heat transferring member is a heat pipe.

15. The apparatus according to claim 14, wherein the heat pipe is inserted into the base portion of the heat absorbing member to a predetermined depth.

16. The apparatus according to claim 13, wherein the fins are plate-like members arranged parallel to each other at predetermined intervals.

17. The apparatus according to claim 13, wherein the base portion of the heat absorbing member, the heat radiating member, and the signal transmission unit include holes that are coaxially formed so that the base portion of the heat absorbing member, the heat radiating member, and the signal transmission unit can be integrally coupled to each other by screws inserted into the holes.

18. The apparatus according to claim 13, wherein the fins of the heat absorbing member are arranged on the base portion of the heat absorbing member.

19. The apparatus according to claim 14, wherein the fins of the heat radiating member are penetrated by the heat pipe.

20. The apparatus according to claim 12, wherein the heat radiating member includes a plurality of fins disposed on the base portion.

21. The assembly according to claim 20, wherein a heat releasing portion of the heat transferring member is at least one of inserted into the base portion of the heat radiating member to a predetermined depth and arranged to be in contact with the base portion of the heat radiating member.

22. The apparatus according to claim 12, wherein the protecting member includes a recess portion that receives the electronic device.

* * * * *